United States Patent [19]

Steffen

[11] Patent Number: 5,041,395

[45] Date of Patent: Aug. 20, 1991

[54] METHOD OF ENCAPSULATING AN INTEGRATED CIRCUIT USING A PUNCHED METAL GRID ATTACHED TO A PERFORATED DIELECTRIC STRIP

[75] Inventor: Francis Steffen, Rousset, France

[73] Assignee: SGS-Thomson Microelectronics S.A., Gentilly, France

[21] Appl. No.: 504,961

[22] Filed: Apr. 5, 1990

[30] Foreign Application Priority Data

Apr. 7, 1989 [FR] France ................. 89 04581

[51] Int. Cl.⁵ ............... H01L 21/56; H01L 21/58; H01L 21/60
[52] U.S. Cl. ................. 437/206; 437/217; 357/70; 357/72; 357/80
[58] Field of Search .............. 437/206, 207, 211, 217, 437/219, 220, 224, 8, 209; 439/841, 827, 837, 840, 68; 206/330; 264/272.17; 357/70, 80; 361/398, 401, 403, 404, 388, 406, 408, 421; 428/571, 572; 228/180.2

[56] References Cited

U.S. PATENT DOCUMENTS

| 4,100,675 | 7/1978 | Landsittel | 29/841 |
| 4,549,247 | 10/1985 | Hoppe et al. | 361/403 |
| 4,674,175 | 6/1987 | Stampfli | 437/209 |

FOREIGN PATENT DOCUMENTS

| 0197438 | 10/1986 | European Pat. Off. | |
| 0231937 | 2/1987 | European Pat. Off. | |
| 55-68643 | 5/1980 | Japan | 437/8 |
| 58-158953 | 9/1983 | Japan | |
| 59-16351 | 1/1984 | Japan | 437/211 |
| 59-143336 | 8/1984 | Japan | 437/211 |
| 61-287125 | 12/1986 | Japan | 437/211 |
| 62-92331 | 4/1987 | Japan | 437/211 |

OTHER PUBLICATIONS

IBM Technical Disclosure Bulletin, vol. 24, No. 2, 7-81 (29/840), "Flexible Tape Interconnection for Chips", L. V. Avletta & R. Marks.

Primary Examiner—Olik Chaudhuri
Assistant Examiner—David E. Graybill
Attorney, Agent, or Firm—Roland Plottel

[57] ABSTRACT

The disclosure concerns the encapsulation of integrated circuit chips, notably with a view to their being incorporated in a chip card. The encapsulation method comprises the formation of a pre-punched metallic conductive grid, the formation of a strip of pre-perforated plastic material, the transfer of a strip to the grid, the positioning of an integrated circuit chip in a perforation of the strip, and the formation of electrical connections between the chip and zones of the grid located in perforations of the strip. The perforations of the strip and the punched slots of the grid are arranged so that the strip covers and blocks all the interstices between conductors of the grid in the useful region corresponding to a module to be made. When a protecting resin is laid, it is confined and does not leak through the interstices of the grid. A plastic or metal ring defines the heightwise dimension of the micromodule.

11 Claims, 2 Drawing Sheets

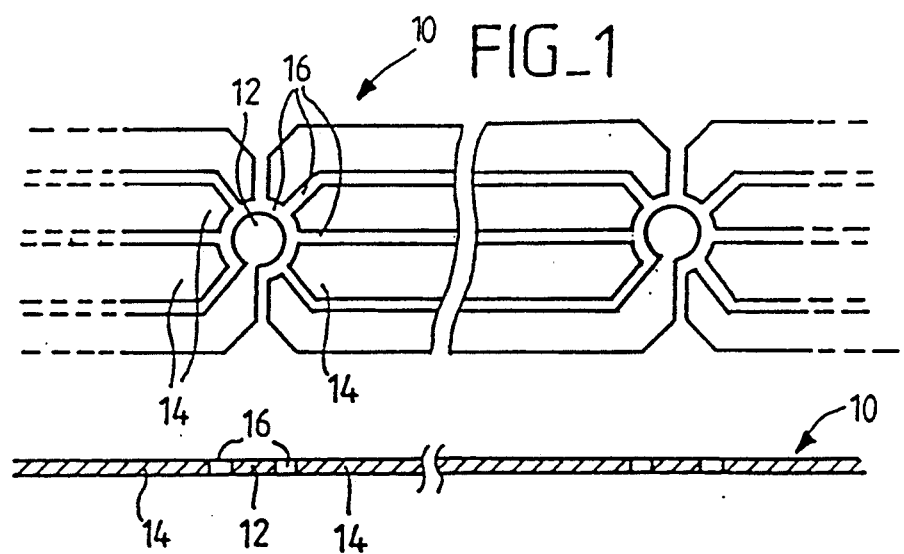
FIG_1
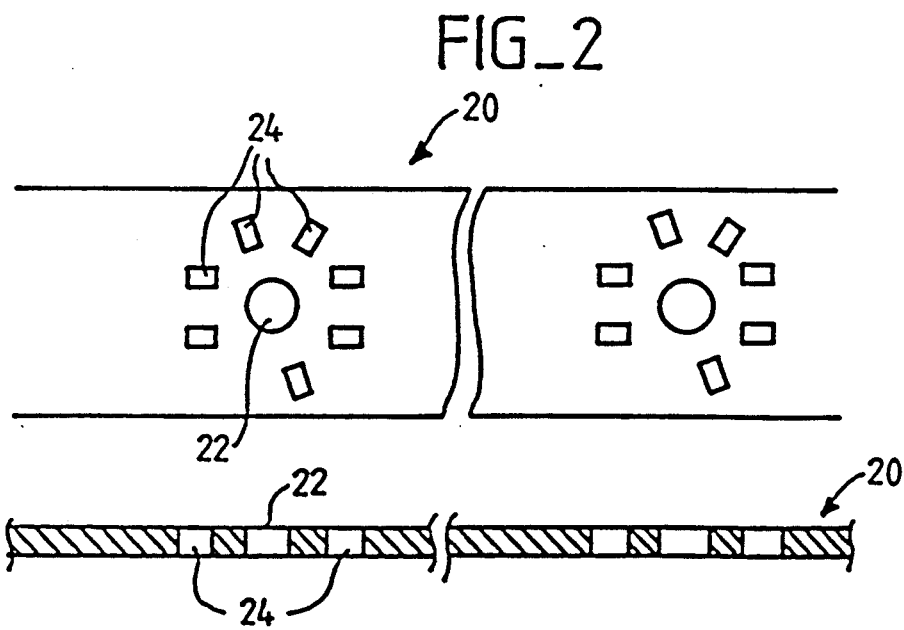
FIG_2
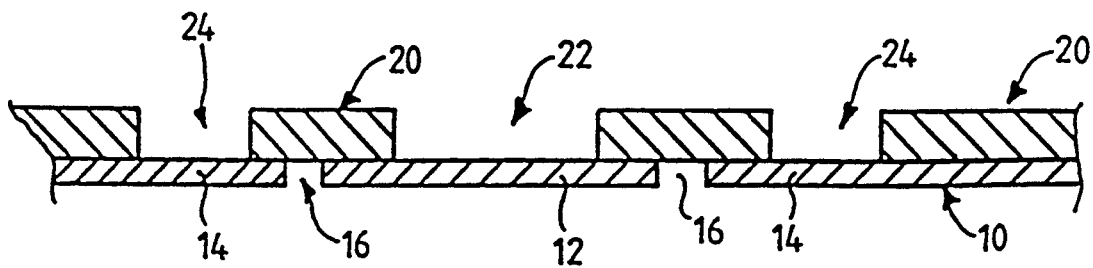
FIG_3

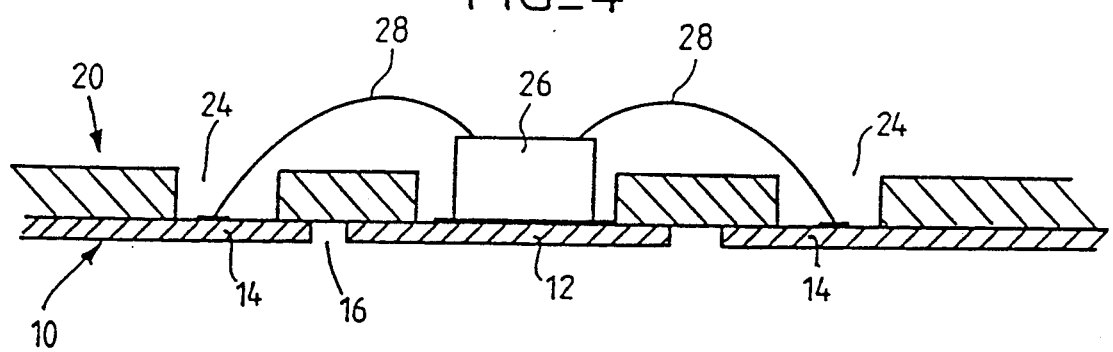
FIG_4
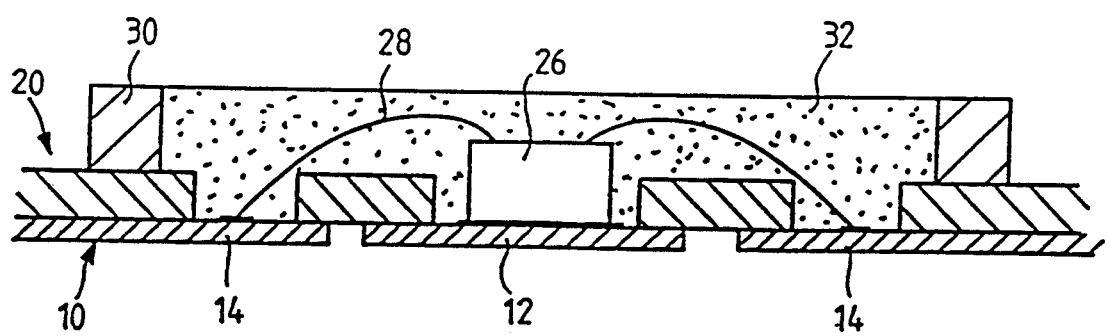
FIG_5
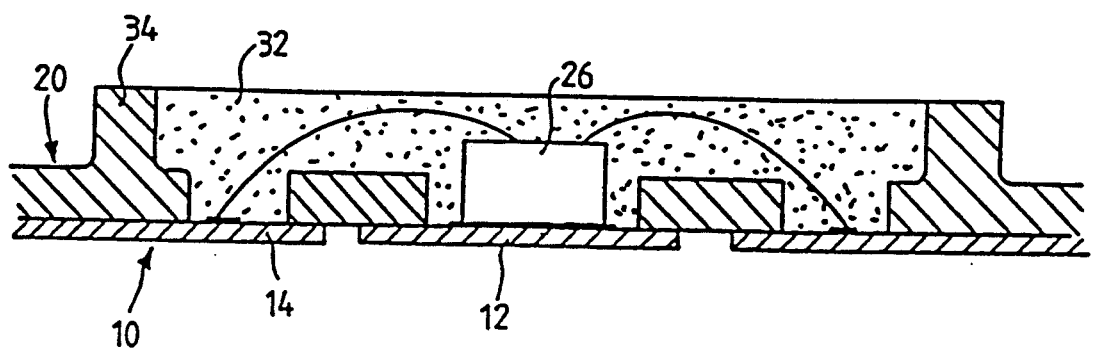
FIG_6

METHOD OF ENCAPSULATING AN INTEGRATED CIRCUIT USING A PUNCHED METAL GRID ATTACHED TO A PERFORATED DIELECTRIC STRIP

BACKGROUND OF THE INVENTION

1. Field of the Invention

The invention concerns the encapsulation of integrated circuit chips, notably with a view to incorporating them in a portable support.

2. Description of the Prior Art

The following is the usual technique for encapsulating integrated circuits designed to be incorporated, for example, into a chip card:

the chip is transferred either to a grid of metallic conductors or to a grid-patterned epoxy glass type of dielectric support bearing photo-etched printed conductors. These conductors have, firstly, a contact zone to which the rear face of a chip is soldered and, secondly, contact zones to which wires, made of gold or aluminium for example, are soldered, these wires being also soldered to output contacts of the chip. These conductors moreover form external connection terminals of the integrated circuit after encapsulation. The contact zones may also be soldered directly to the chip (by the so-called TAB technique);

the chip and its wires are partially or totally covered with a protection against mechanical and chemical aggression; this protection may be provided by an epoxy resin or a silicone resin;

the strip carrying the chips protected by the resin is punched out into individual micromodules;

the micromodule is bonded in a surface cavity made in a portable support made of plastic material, in such a way that the connection conductors remain accessible at the surface.

The plastic support may be made by injection molding (the plastic material is then, for example, ABS resin). It may also be made by machining. It may be made by rolling pre-punched sheets of plastic material (the punched slots are used notably to make the cavity house of the micromodule); in this case, the plastic material may be polyvinyl chloride.

Several problems are encountered in these techniques for assembling the module in its insertion support. A first problem is the risk that the resin protecting the chip might flow between the conductors when it is deposited. The overflow hinders the operations for assembling the module on its support. A second problem, in the case of a card, is the obligation to assemble the micromodule by bonding. The reliability of this mode of transfer is not ideal in view of the difference between the materials forming the card and those forming the micromodule. A third problem is the indefinite reproduction of the external dimensions of the micromodule which has to fit into a cavity with given dimensions (preferably very shallow) of the chip card.

The invention is aimed at improving the reliability of assembly, achieving reproducibility of the dimensions of the micromodule and reducing its height while, at the same time, preserving a fabrication method that is easy to implement.

SUMMARY OF THE INVENTION

According to the invention, there is proposed a method for the encapsulation of an integrated circuit consisting essentially, starting from a composite substrate of plastic material and metal formed by the transfer (by bonding or hot transfer) of a pre-perforated dielectric screen to a pre-punched metal grid. In one example, this dielectric screen is a strip of plastic material. In another example, this screen is a molded, punched or machined preform.

The method more particularly comprises the following operations:

preparation of a grid of connection conductors by the punching of a metal strip;

preparation of a dielectric screen perforated at certain places;

transfer of the dielectric screen to the grid, by bonding or hot transfer, the transfer being such that zones of the metal grid are facing perforations of the screen;

positioning of a integrated circuit chip on an exposed zone of the metal grid, through a perforation in the screen;

soldering of conducting connections between the chip and exposed zones of the metal grid;

protection of the chip and connections by a dielectric or antistatic protecting material covering the chip and the connections in the perforations of the screen.

Preferably, the slots of the grid and the perforations of the strip are such that the grid fully blocks all the perforations of the strip, at least in the useful zone of the contacts of the encapsulated module thus made.

The "hot transfer" of the dielectric screen to the grid implies an operation by which the dielectric screen is unrolled in a strip and applied against the grid at a temperature at which the strip gets softened. The strip adheres to the grid during the cooling. In this case, it is preferably seen to it that the grid has rough features and slots that contribute to catching the strip. These rough features are for example, punching burrs that have not been removed, projecting snugs on the grid, holes etc.

The strip of plastic material may be formed by a flat tape. In this case, it is preferably provided that, before a protective material is deposited, or even before the chip is positioned, the zone comprising the chip and its connections is surrounded by a protective ring with a height that is as small as possible but enough to go beyond the height of the chip and of the connections (especially if these connections are soldered wires). This ring is used to form a cavity into which the protective material is poured. It may be a metal ring.

The strip of plastic material may also be formed by a flat tape having ring-shaped protuberances from place to place. Instead of being transferred to the strip at a later stage, the ring may be formed at the same time as the strip, for example by molding or machining.

The protective material may be a thermoplastic resin (of the polyurethane type) or thermosetting resin (of the silicone type). It is an insulator in principle, but may preferably be an imperfect dielectric (to achieve a resistance of the order of 10 to 10000 megohms). This enables the flow of the electrostatic charges through the connection wires.

When the protective resin is laid, it does not leak through the interstices of the punched grid for, preferably, care has been taken to see to it that these interstices are all blocked by the strip of plastic material, at least in the useful parts.

Thus a micromodule is made having, firstly, an insulating material (plastic) which is the perforated strip transferred by bonding or by hot transfer to the punched grid of conductors and, secondly, preferably a protective material (resin) to complete the protection of the chip against chemical and mechanical aggression. The perforations of the strip overlap conductive zones of the punched grid without overlapping interstices between these zones. An integrated circuit chip is placed in a perforation of the strip and is electrically connected to conductive zones located in other perforations of the strip.

For incorporation in a card, it is preferably provided that the material of the transferred plastic screen is compatible with the plastic material of the card (polyvinyl chloride for example), and it is thus possible to place the micromodule directly in a cavity formed in the card, the strip of plastic material of the micromodule being directly in contact with the plastic material of the card. The mounting is done by bonding or ultrasonic soldering for example. This was difficult to carry out in the prior art with materials on the card and on the micromodule that had little compatibility with each other

BRIEF DESCRIPTION OF THE DRAWINGS

Other features and advantages of the invention will appear from the following detailed description, made with reference to the appended figures, wherein:

FIG. 1 shows a top view and a sectional view of a punched metal grid used in the invention;

FIG. 2 shows a top view and a sectional view of a strip of pre-perforated dielectric screens used according to the invention.

FIG. 3 shows a sectional view of the strip transferred by bonding or hot transfer to the grid;

FIG. 4 shows an integrated circuit chip positioned and connected to the grid;

FIG. 5 shows the positioning of a ring and of a protective resin; the ring may even preferably be positioned before the chip;

FIG. 6 shows an alternative embodiment wherein the protecting ring is integrated into the strip and not transferred to it.

DESCRIPTION OF PREFERRED EMBODIMENTS

The method according to the invention shall now be described in detail with reference to the figures. The method starts with a pre-punched metal grid 10 in FIG. 1 defining the future electrical connection terminals of the micromodule to be fabricated. In practice, what is made is not an isolated grid for a single micromodule but a grid in a continuous strip. The micromodules will be made serially on this strip. They will be separated from one another only at the end of the fabrication process or even, in the case of micromodules designed for chip cards, only at the time of insertion into cards.

The metal grid is formed by mechanical punching. It has a thickness of about some tenths of millimeters. It is therefore relatively strong. It may be made of iron-nickel or copper for example or, again, of pure nickel. It may be coated with gold or silver on the rear face, and on the front face at the position where connections with a chip will be soldered.

In principle, the grid has a conductive central zone 12 to receive an integrated circuit chip, and peripheral conductive zones 14 surrounding this central zone. The zones are separated from one another by interstices 16 formed by the punching operation. These interstices can be seen in the top view and the sectional view of FIG. 1.

Furthermore, a perforated plastic strip of dielectric screens 20, in the form of an essentially plane tape form is made (FIG. 2). Perforations are made, for example by stamping in this strip, at carefully chosen places. In principle, these perforations include a central hole 22 (to house an integrated circuit chip) and peripheral holes 24 (for access to the connection terminals).

The positions of the central hole 22 and the central zone 12 correspond to each other in such a way that, when the plastic strip is transferred to the metal grid, the central hole 22 comes on top of the central zone 12, preferably without coming on top of an interstice 16 of the punched grid. The central hole 22 is therefore smaller than the zone 12 and will be placed inside this zone.

Similarly, the positions of the peripheral holes correspond to the positions of the peripheral conductive zones in such a way that, when the strip 20 is transferred to the grid 10, each peripheral hole 24 faces an end of a respective conductive zone 14. Here again, preferably, the holes do not overlap interstices 16 between conductive zones.

Starting from the pre-punched grid and the pre-perforated strip, an operation is conducted for transferring the strip to the grid, in keeping to the relative positions indicated above. In principle, therefore, the plastic strip will block all the interstices between conductive zones of the grid.

The transfer can be done by simple bonding: the perforated plastic strip and the punched grid tape are unrolled simultaneously, in interposing a fine layer of bonder between both of them and pressing the strip against the grid. The transfer can be done also by hot transfer by simply pressing the strip against the grid at a temperature where the material forming the strip is softened (for example, a temperature of 150 to 200 degrees Celsius depending on the plastic material used). This hot pressing enables the strip to catch on to the grid efficiently during the cooling stage.

The catching-on process is helped along if the surface of the grid has rough features (punching burrs, folds of snugs projecting in a direction perpendicular to the grid tape surface, or in an oblique direction, etc.).

FIG. 3 shows the grid and the strip superimposed, in a sectional view on an enlarged scale (but an arbitrary one: the relative thicknesses of the layers and widths shown are not significant).

It can be ascertained, in FIG. 3, that it has been seen to it that the central hole 22 is placed on top of the central zone 12, without going beyond this zone. And the holes 24 are placed on top of ends of conductive zones 14, without going beyond, on the top of the interstices 16.

The interstices of the grid are therefore all blocked, in any case in the useful region of the micromodule.

A chip 26 is then positioned on the composite metal/plastic tape thus formed (FIG. 4).

In the example shown, the chip 26 is bonded or soldered by its rear face to the central conductive zone 12, inside the hole 22. It is connected to the peripheral conductive zones 14 by connecting wires 28 (gold or aluminium wires for example). These wires are soldered firstly to contacts of the chip and, secondly, to the conductive zones 14 inside holes 24 of the plastic strip 20.

The surfaces of the punched metal grid of the rear side, namely the side not covered by the strip 20, will be the contact surfaces providing access to the integrated circuit from the exterior, notably when the micromodule is incorporated in a chip card.

A protecting ring 30 is placed around the chip 26 and connecting wires 28 (FIG. 5). This ring is preferably metallic (but it could be made of plastic); it may be bonded or hot-transferred to the plastic strip 20. In this case, the ring is preferably transferred before the chip is positioned. The ring surrounds the central and peripheral perforations formed in the strip 20 and corresponding to a determined micromodule. It may be supposed that a micromodule will include several chips which may or may not be connected to one another, in which case the ring will surround all the chips and the connecting wires corresponding to this micromodule. Taking into account the thickness of the strip 20, the height of the ring is chosen so that the upper edge of the ring goes beyond the height of the chip and the wires.

The ring and the composite plastic/metal tape then define a cavity for the protection of the chip and the wires. This cavity is filled with a protecting material 32 (for example, a thermoplastic resin such as polyurethane or a thermosetting resin such as silicone resin). The protecting material completely coats the chip and the wires. Its volume is defined laterally by the protecting ring. Heightwise, the material preferably fills the ring completely. If it goes beyond the ring during the filling process, it can subsequently be levelled down.

Since it has been seen to it that all the perforations of the plastic strip 20 are completely blocked with portions of conductive grid 10, the resin, even if it is very fluid, does not leak through the interstices 16 between the conductive zones of the grid.

FIG. 6 shows an alternative embodiment which is distinguished from the preceding one in that the protecting ring is not a ring transferred to the strip 20 but a molded or machined, integral part of the strip 20. This part 34 forms projections from place to place (at the position of each micromodule) on the plane tape forming the strip 20.

The rear face of the grid is totally bared, i.e. not coated with insulating material. The rear face of the grid will remain directly accessible for an electrical contact between the conductors and contacts of a chip card reader.

Thus, a composite metal/plastic tape is made, bearing, from place to place, chips protected by a ring and an insulating protective material. Thus, a roll of micromodules in strip form is formed. The strip will be punched into individual micromodules only at the end of fabrication of the micromodules, or even only at the time of insertion into cards.

The precision obtained in the dimensions of the micromodule is very high and reproducible from one micromodule to another. Therefore, there will be no trouble, as in the past, because of problems of imprecision of the dimensions, both heightwise and in width, of the drop of protective resin.

The height of the ring 30 can be reduced to the strict minimum since it is very well controlled. It is important for a chip card that the micromodule should have as small a height as possible but, for this purpose, there should be a very reliable fabrication process, and this is what the invention provides.

What is claimed is:

1. A method for the encapsulation of an integrated circuit, comprising formation of a prepunched metal conductive grid, formation of a strip of preperforated dielectric screen, transfer of the strip to the grid, positioning of an integrated circuit chip in a perforation of the strip, and formation of electrical connections between the chip and zones of the grid located in perforations of the strip.

2. A method for the encapsulation of an integrated circuit, comprising formation of a prepunched metal conductive grid, formation of a strip of preperforated dielectric screen, transfer of the strip to the grid, positioning of an integrated circuit chip in a perforation of the strip, and formation of electrical connections between the chip and zones of the grid located in perforations of the strip, and wherein the perforations of the strip and punched slots of the grid are such that the strip covers and blocks all interstices between conductors of the grid in a region in which a chip may be placed.

3. A method according to claim 1, comprising a step for setting up of protection by a protecting material covering the chip and the connections in the perforations of the strip.

4. A method according to claim 3, comprising a step for positioning, on the strip, of a protecting ring surrounding the chip and its connections, this ring being filled with protecting insulator material after it has been positioned.

5. A method according to claim 3, wherein, the strip has a ring-shaped protuberance surrounding the space reserved for the chip and its connections, and wherein this ring is filled with a protecting material after the chip and its connections have been positioned.

6. A method according to any of the claims 3 to 5 or 11 to 13 wherein the protecting material is a thermoplastic or thermosetting resin.

7. A method according to claim 6, wherein the protecting material is an imperfect dielectric to enable the outflow of electrostatic charges.

8. A method according to claim 1 or claim 2, wherein the strip is transferred to the screen by bonding or hot transfer.

9. A method according to claim 2, comprising a step for setting up of protections by a protecting material covering the chip and the connections in the perforations of the strip.

10. A method according to claim 9, comprising a step for positioning, on the strip of a protecting ring surrounding the chip and its connections, this ring being filled with protecting insulator material after it has been positioned.

11. A method according to claim 11, wherein, the strip has a ring-shaped protuberance surrounding the space reserved for the chip and its connections, and wherein this ring is filled with a protecting material after the chip and its connections have been positioned.

* * * * *